United States Patent
Lewis et al.

(10) Patent No.: US 10,141,936 B2
(45) Date of Patent: Nov. 27, 2018

(54) PIPELINED INTERCONNECT CIRCUITRY WITH DOUBLE DATA RATE INTERCONNECTIONS

(71) Applicant: Altera Corporation, San Jose, CA (US)

(72) Inventors: David Lewis, Toronto (CA); Herman Henry Schmit, Palo Alto, CA (US); Carl Ebeling, Redwood City, CA (US)

(73) Assignee: Altera Corporation, San Jose ( * ) Notice: Subject to any disclaimer, the term of this patent is extended or adjusted under 35 U.S.C. 154(b) by 1 day.

(21) Appl. No.: 15/630,436

(22) Filed: Jun. 22, 2017

(65) Prior Publication Data

US 2017/0288671 A1    Oct. 5, 2017

Related U.S. Application Data

(63) Continuation of application No. 14/464,340, filed on Aug. 20, 2014, now Pat. No. 9,692,418.

(51) Int. Cl.
*H03K 19/0175*  (2006.01)
*H03K 19/173*  (2006.01)
*H03K 19/0185*  (2006.01)

(52) U.S. Cl.
CPC ........... *H03K 19/017581* (2013.01); *H03K 19/017509* (2013.01); *H03K 19/018521* (2013.01); *H03K 19/1737* (2013.01)

(58) Field of Classification Search
None
See application file for complete search history.

(56) References Cited

U.S. PATENT DOCUMENTS

| | | | |
|---|---|---|---|
| 6,525,565 B2 | 2/2003 | Young et al. | |
| 6,628,679 B1 * | 9/2003 | Talarek | H04J 3/047 370/536 |
| 6,777,980 B2 | 8/2004 | Young et al. | |
| 7,132,854 B1 | 11/2006 | Chen et al. | |
| 7,317,773 B2 | 1/2008 | Young et al. | |
| 7,460,431 B1 | 12/2008 | Pan et al. | |
| 7,734,944 B2 | 6/2010 | Chen et al. | |
| 7,751,475 B1 * | 7/2010 | Crandall | H04N 19/149 375/240.03 |
| 7,752,475 B2 | 7/2010 | Berry et al. | |
| 7,864,084 B2 * | 1/2011 | Padaparambil | H03M 9/00 341/100 |
| 2002/0130795 A1 | 9/2002 | Moon | |

(Continued)

*Primary Examiner* — Minh D A
*Assistant Examiner* — James H Cho
(74) *Attorney, Agent, or Firm* — Treyz Law Group, P.C.; Tianyi He

(57) ABSTRACT

An integrated circuit may have pipelined interconnects that are configurable to operate in registered single data rate mode, registered double data rate mode, or in combinational mode. The pipelined interconnect may include routing multiplexers for selecting incoming signals, circuitry for serialization and de-serialization, and memory elements that are configurable to store one or two signals per clock period. Operating the pipeline interconnects in double data rate mode may provide a trade-off between reducing the number of physical wires that are required to implement a design at a constant bandwidth or increasing the bandwidth while keeping the number of physical wires constant.

19 Claims, 12 Drawing Sheets

(56) References Cited

U.S. PATENT DOCUMENTS

| | | | |
|---|---|---|---|
| 2002/0175704 A1* | 11/2002 | Young | H04J 3/047 326/46 |
| 2004/0008055 A1 | 1/2004 | Khanna et al. | |
| 2008/0094104 A1* | 4/2008 | Whetsel | G01R 31/318544 326/62 |
| 2009/0219764 A1 | 9/2009 | Shin et al. | |
| 2010/0251042 A1 | 9/2010 | Selking | |

\* cited by examiner

PIPELINED INTERCONNECT CIRCUITRY WITH DOUBLE DATA RATE INTERCONNECTIONS

This application is a continuation of patent application Ser. No. 14/464,340, issued as U.S. Pat. No. 9,692,418, filed Aug. 20, 2014, which is hereby incorporated by reference herein in its entirety. This application claims the benefit of and claims priority to patent application Ser. No. 14/464, 340, issued as U.S. Pat. No. 9,692,418, filed Aug. 20, 2014.

BACKGROUND

This invention relates to integrated circuits and, more particularly, to pipelined interconnect circuitry with double data rate interconnections on an integrated circuit.

Every transition from one technology node to the next technology node has resulted in smaller transistor geometries and thus potentially more functionality implemented per unit of integrated circuit area. Synchronous integrated circuits have further benefited from this development as evidenced by reduced interconnect and cell delays, which have led to performance increases. However, more recent technology nodes have seen a significant slow-down in the reduction of delays (i.e., a slow-down in the performance increase).

To further increase the performance, solutions such as register pipelining have been proposed, where additional registers are inserted between synchronous elements, thereby increasing latency for the benefit of increased clock frequencies and throughput. However, performing register pipelining often involves spending significant time and effort because several iterations of locating performance bottlenecks, inserting and removing registers, and compiling the modified integrated circuit design are usually required.

Situations frequently arise where a register pipelined integrated circuit design still exhibits an unsatisfactory performance after many iterations of inserting and removing registers because synchronous elements are placed far from each other and existing routing architectures do not support a high speed connection across the integrated circuit in an efficient manner.

SUMMARY

In accordance with certain aspects of the invention, an integrated circuit may have an interconnect circuit and a control circuit. The interconnect circuit may receive a first signal from a first wire, a second signal from a second wire, and transmit a third signal of which at least a portion is based on one of the first and second signals to the third wire.

The control circuit, which may be coupled to the interconnect circuit, may configure the interconnect circuit to operate as a combinational interconnect circuit in a first mode, as a registered single data rate interconnect circuit in a second mode, and as a registered double data rate interconnect circuit in a third mode.

It is appreciated that the present invention can be implemented in numerous ways, such as a process, an apparatus, a system, a device, or a method on a computer readable medium. Several inventive embodiments of the present invention are described below.

In certain embodiments, the above-mentioned interconnect circuit may include a multiplexer. The multiplexer may receive the first signal from the first wire, the second signal from the second wire, and a control signal from the control circuit. The multiplexer may further produce a multiplexer output signal by selecting at least one of the first and second signals based on the control signal.

The control signal may be a periodic signal with first and second signal levels during first and second portions of the periodic signal, respectively. The multiplexer may select the first signal during the first and second portions of the periodic signal. Alternatively, the multiplexer may select the first signal during the first portion and the second signal during the second portion of the periodic signal.

If desired, the integrated circuit may further include a routing multiplexer. The routing multiplexer may receive a plurality of signals from a plurality of wires, select the first signal among the plurality of signals, and send the first signal to the first wire.

Further features of the invention, its nature and various advantages, will be more apparent from the accompanying drawings and the following detailed description of the preferred embodiments.

DETAILED DESCRIPTION

The present invention relates to integrated circuits and, more particularly, to pipelined interconnect circuitry with double data interconnections on an integrated circuit.

As the functionality implemented per unit of die area continues to increase, it becomes increasingly challenging for existing routing architectures to support a high speed connection across an integrated circuit die. Thus, situations frequently arise where the critical path between sequential elements spans a large distance across the die.

Solutions such as register pipelining have been proposed to further increase the performance. During register pipelining, additional registers are inserted between synchronous elements which leads to an increase in latency at the benefit of increased clock frequencies and throughput. However, performing register pipelining often involves spending significant time and effort because several iterations of locating performance bottlenecks, inserting or removing registers, and compiling the modified integrated circuit design are usually required.

Therefore, solutions have been proposed that include interconnect circuitry with embedded registers that can be activated through a configuration process. However, adding registers to interconnect circuitry may increase the area of the integrated circuit and thereby result in a cost increase.

It may therefore be desirable to improve the usage of the interconnect circuitry with embedded registers, for example by introducing pipelined interconnect circuitry with double data rate interconnections.

It will be recognized by one skilled in the art, that the present exemplary embodiments may be practiced without some or all of these specific details. In other instances, well-known operations have not been described in detail in order not to unnecessarily obscure the present embodiments.

Figure 1:
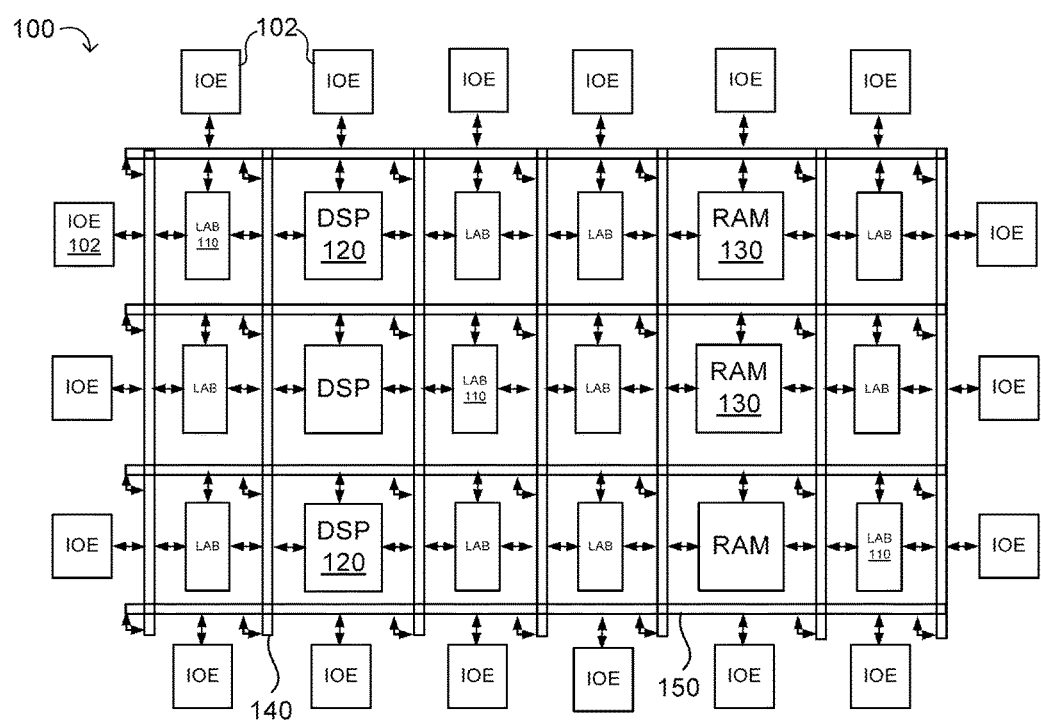
FIG. 1 is a diagram of an illustrative integrated circuit having an exemplary routing topology in accordance with an embodiment.

An illustrative embodiment of an integrated circuit such as programmable logic device (PLD) 100 having an exemplary interconnect circuitry is shown in FIG. 1. As shown in FIG. 1, the programmable logic device (PLD) may include a two-dimensional array of functional blocks, including logic array blocks (LABs) 110 and other functional blocks, such as random access memory (RAM) blocks 130 and digital signal processing (DSP) blocks 120, for example. Functional blocks such as LABs 110 may include smaller programmable regions (e.g., logic elements, configurable logic blocks, or adaptive logic modules) that receive input signals and perform custom functions on the input signals to produce output signals.

Programmable logic device 100 may contain programmable memory elements. Memory elements may be loaded with configuration data (also called programming data) using input/output elements (IOEs) 102. Once loaded, the memory elements each provide a corresponding static control signal that controls the operation of an associated functional block (e.g., LABs 110, DSP 120, RAM 130, or input/output elements 102).

In a typical scenario, the outputs of the loaded memory elements are applied to the gates of metal-oxide-semiconductor transistors in a functional block to turn certain transistors on or off and thereby configure the logic in the functional block including the routing paths. Programmable logic circuit elements that may be controlled in this way include parts of multiplexers (e.g., multiplexers used for forming routing paths in interconnect circuits), look-up tables, logic arrays, AND, OR, NAND, and NOR logic gates, pass gates, etc.

The memory elements may use any suitable volatile and/or non-volatile memory structures such as random-access-memory (RAM) cells, fuses, antifuses, programmable read-only-memory memory cells, mask-programmed and laser-programmed structures, combinations of these structures, etc. Because the memory elements are loaded with configuration data during programming, the memory elements are sometimes referred to as configuration memory, configuration RAM (CRAM), configuration memory elements, or programmable memory elements.

In addition, the programmable logic device may have input/output elements (IOEs) 102 for driving signals off of PLD and for receiving signals from other devices. Input/output elements 102 may include parallel input/output circuitry, serial data transceiver circuitry, differential receiver and transmitter circuitry, or other circuitry used to connect one integrated circuit to another integrated circuit. As shown, input/output elements 102 may be located around the periphery of the chip. If desired, the programmable logic device may have input/output elements 102 arranged in different ways. For example, input/output elements 102 may form one or more columns of input/output elements that may be located anywhere on the programmable logic device (e.g., distributed evenly across the width of the PLD). If desired, input/output elements 102 may form one or more rows of input/output elements (e.g., distributed across the height of the PLD). Alternatively, input/output elements 102 may form islands of input/output elements that may be distributed over the surface of the PLD or clustered in selected areas.

The PLD may also include programmable interconnect circuitry in the form of vertical routing channels 140 (i.e., interconnects formed along a vertical axis of PLD 100) and horizontal routing channels 150 (i.e., interconnects formed along a horizontal axis of PLD 100), each routing channel including at least one track to route at least one wire. If desired, the interconnect circuitry may include double data rate interconnections and/or single data rate interconnections. A double data rate interconnection may convey twice the amount of data compared to a single data rate interconnection when operated at the same clock frequency.

If desired, routing wires may be shorter than the entire length of the routing channel. A length L wire may span L functional blocks. For example, a length four wire may span four blocks. Length four wires in a horizontal routing channel may be referred to as "H4" wires, whereas length four wires in a vertical routing channel may be referred to as "V4" wires.

Different PLDs may have different functional blocks which connect to different numbers of routing channels. A three-sided routing architecture is depicted in FIG. 1 where input and output connections are present on three sides of each functional block to the routing channels. Other routing architectures are also intended to be included within the scope of the present invention. Examples of other routing architectures include 1-sided, 1-sided, 2-sided, and 4-sided routing architectures.

In a direct drive routing architecture, each wire is driven at a single logical point by a driver. The driver may be associated with a multiplexer which selects a signal to drive on the wire. In the case of channels with a fixed number of wires along their length, a driver may be placed at each starting point of a wire.

Note that other routing topologies, besides the topology of the interconnect circuitry depicted in FIG. 1, are intended to be included within the scope of the present invention. For example, the routing topology may include wires that travel diagonally or that travel horizontally and vertically along different parts of their extent as well as wires that are perpendicular to the device plane in the case of three dimensional integrated circuits, and the driver of a wire may be located at a different point than one end of a wire. The routing topology may include global wires that span substantially all of PLD 100, fractional global wires such as wires that span part of PLD 100, staggered wires of a particular length, smaller local wires, or any other suitable interconnection resource arrangement.

Furthermore, it should be understood that embodiments of the present invention may be implemented in any integrated circuit. If desired, the functional blocks of such an integrated circuit may be arranged in more levels or layers in which multiple functional blocks are interconnected to form still larger blocks. Other device arrangements may use functional blocks that are not arranged in rows and columns.

Figure 2:
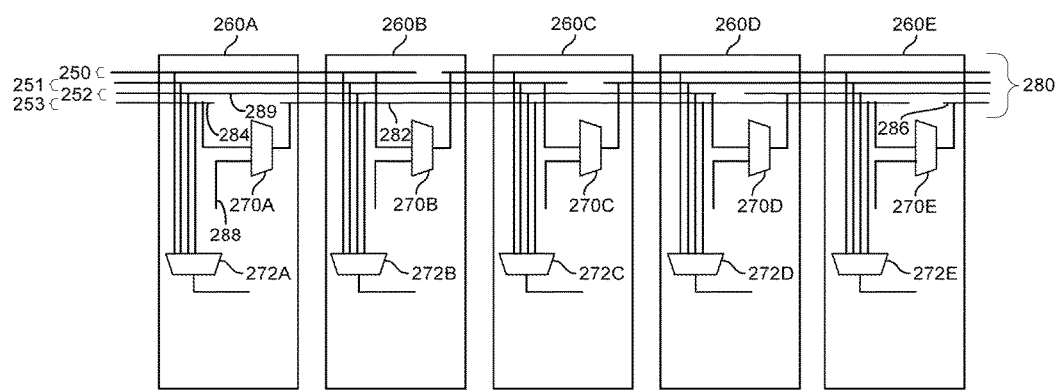
FIG. 2 is a diagram of an illustrative interconnect circuit with staggered wires in accordance with an embodiment.

FIG. 2 shows a direct drive horizontal routing channel 280 including a single bundle of wires across functional blocks 260. Each functional block 260 may have a driver (not shown) to drive a signal on a wire that starts in the respective functional block (e.g., wire 286).

Each driver may be associated with a multiplexer such as multiplexer 270. For example, multiplexer 270E may be configured to select a signal to drive on wire 286, and multiplexer 270A may be configured to select a wire that ends in the respective functional block (e.g., wire 284). Connecting a wire that ends in a functional block to a wire that starts in that identical functional block is sometimes also referred to as "wire stitching" or stitching. If desired, tri-state circuits may perform the wire stitching instead of multiplexers 270, which may result in a bi-directional routing channel 280. Alternatively, wires may perform the wire stitching (e.g., by blowing fuses during configuration or by adding wires in a mask-programmable device). In other words, wires may directly connect to other wires to implement a long wire (not shown).

If desired, multiplexer 270E may be configured to select a signal from a different wire. For example, multiplexer 270E may select a signal from a wire driven by a block within functional block 260E. Multiplexer 270E may also select a signal from a wire in another routing channel such as a signal from a wire in a vertical routing channel that ends in the respective functional block (not shown).

Each functional block 260 may include one or more multiplexers 272 (e.g., multiplexer 272A in functional block 260A), which may be configured to route a wire of routing channel 280 to a block within the respective functional block 260.

As shown, each wire of routing channel 280 is unidirectional from left to right and has a length of four. In other words, a wire that starts in functional block 260A will end in the functional block 260E. If desired, routing channel 280 may be bi-directional (e.g., with tri-state buffers performing the wire stitching) or unidirectional from right to left (e.g., with multiplexers performing wire stitching in the opposite direction as shown in FIG. 2). If desired, the wires in routing channel 280 may have any length. For example, the wires may have a length of two which may require wire stitching in every other functional block 260.

Figure 3:
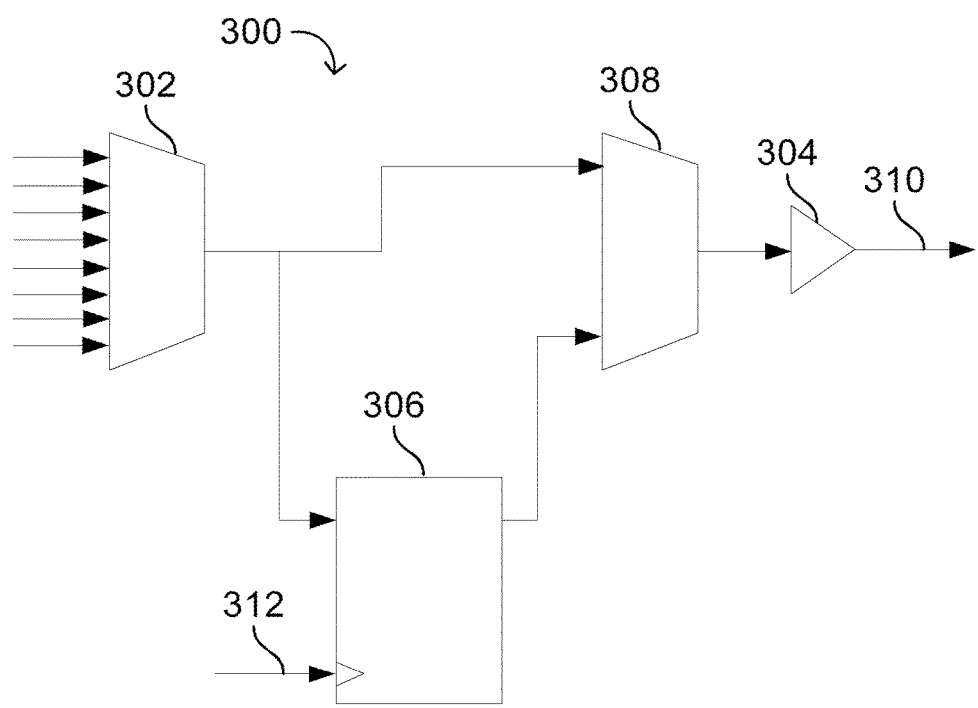
FIG. 3 is a diagram of an illustrative pipelined routing resource which uses a register to pipeline a routing signal in accordance with an embodiment.

If desired, routing channel 280 may include pipeline circuits which are sometimes also referred to as pipeline elements. FIG. 3 depicts a pipelined routing resource 300 which uses a register in accordance with an embodiment of the invention. As shown, the pipelined routing resource 300 includes a first multiplexer 302, a driver 304, a register 306, and a second multiplexer 308.

Multiplexer 302 may be a driver input multiplexer (DIM) or a functional block input multiplexer (FBIM). A DIM drives a routing wire 310 and may select from multiple sources that can drive the wire. The multiple sources may include signals from outputs of functional blocks and other routing wires that travel in the same or in an orthogonal direction to the wire. A FBIM outputs a signal to a functional block and may select the signal from multiple routing wires.

As shown in FIG. 3, in accordance with an embodiment of the invention, the multiplexer 302 may be pipelined by providing its output to the data input of register 306. Multiplexer 308 in the pipelined routing resource 300 may receive the output of multiplexer 302 directly and may also receive the data output from register 306.

Although the pipelined routing resource 300 includes a register, it will be recognized by one skilled in the art that different circuits may be used to store a routing signal such as a pulse latch, a low-transparent latch, or a high-transparent latch, just to name a few. Thus, in order not to unnecessarily obscure the present embodiments, we may refer to the storage circuit in the pipelined routing resource as a memory element or a register.

Register 306 may store a routing signal based on a periodic control signal that register 306 may receive over wire 312. For example, register 306 may store a routing signal once during a period of the periodic control signal (e.g., at each rising edge of the periodic control signal) to accommodate a single data rate routing signal (i.e., the register operates in single data rate mode). As another example, register 306 may store a routing signal two times during a period of the periodic control signal (e.g., at each rising and each falling edge of the periodic clock signal) to accommodate a double data rate routing signal (i.e., the register operates in double data rate mode). If desired, register 306 may be configurable to operate either in single data rate mode or in double data rate mode.

Multiplexer 308 may enable the pipelined routing resource 300 to be either used in a non-pipeline mode or in a pipeline register mode. In the non-pipeline mode, the output of multiplexer 308 selects the direct output of multiplexer 302, thereby bypassing register 306.

In the pipeline mode, multiplexer 308 may select the output of register 306. Multiplexer 308 may provide its output to driver circuit 304, and the output of driver circuit 304 may be used to drive routing wire 310. Routing wire 310 may span multiple functional blocks (e.g., for a pipelined routing resource with a DIM). Alternatively, routing wire 310 may be inside a functional block (e.g., for a pipelined routing resource with a FBIM).

Every DIM/FBIM may include a register such as register 306 such that all the routing multiplexers are pipelined. However, in some embodiments, that may be unnecessary as the capabilities provided may exceed design requirements. Thus, in certain embodiments only a fraction, such as one-half or one-fourth, of the routing multiplexers may be pipelined. For example, a signal may take 150 picoseconds (ps) to traverse a wire of a given length, but a clock signal may be constraint to operate with a 650 ps clock cycle. Thus, providing a pipeline register such as register 306 every fourth wire may be sufficient in this example. Alternatively the registers may be placed more frequently than every fourth wire (e.g., every second wire) to provide a higher degree of freedom in selection of which registers are used.

Placing registers frequently may lead to many pipeline registers in the routing channels of an integrated circuit. Thus, it may be desirable to use double data rate interconnections, which may transport twice the amount of data compared to a single data rate interconnection. Transporting signals at twice the clock rate may require serialization of two single data rate routing signals in a double data rate routing signal and the de-serialization of the double data rate routing signal into two single data rate routing signals.

Figure 4:
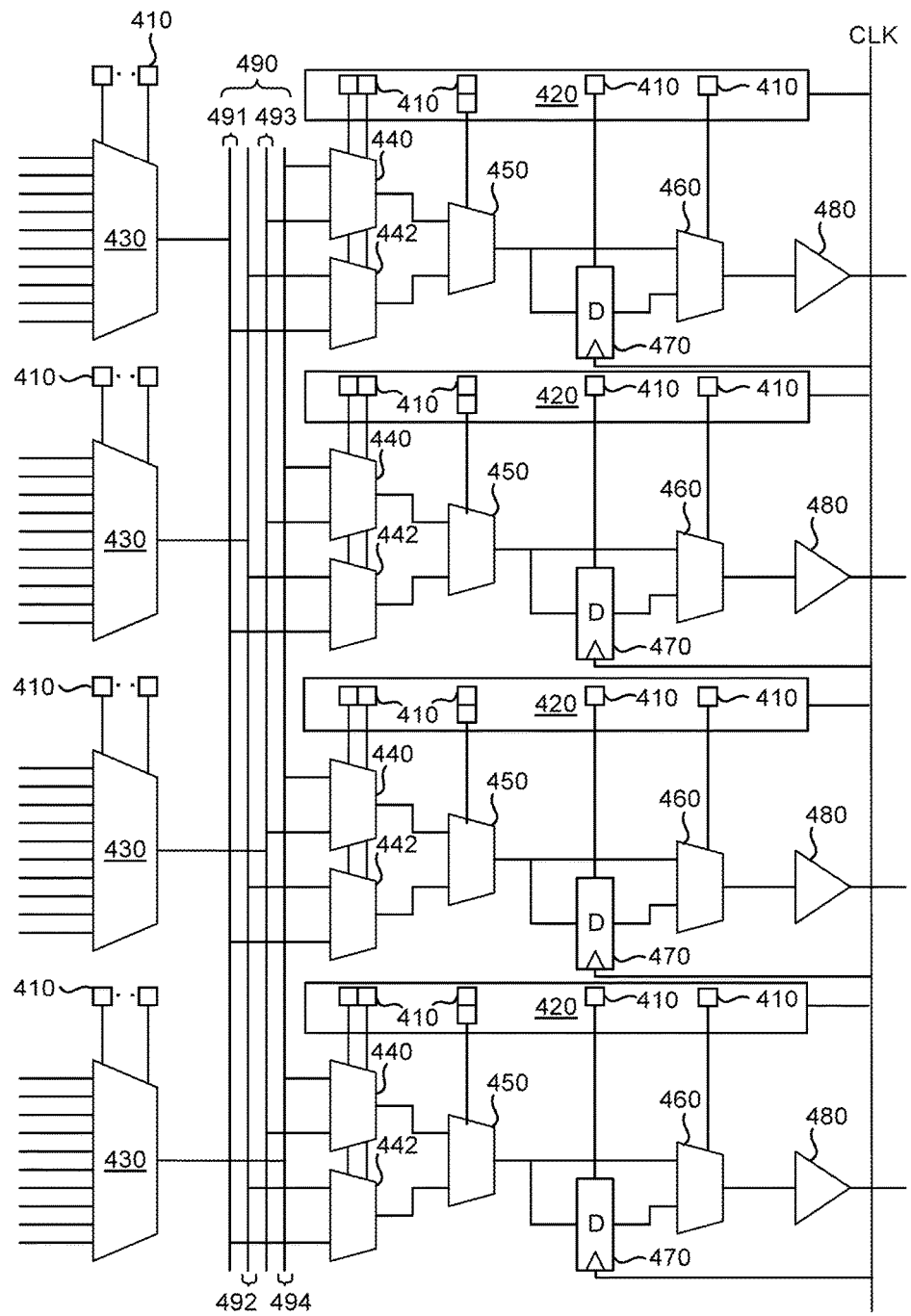
FIG. 4 is a diagram of an illustrative pipelined interconnect circuit that is configurable to operate as a registered single data rate interconnection, a registered double data rate interconnection, or a combinational interconnection in accordance with an embodiment.

FIG. 4 shows an embodiment of an illustrative pipelined interconnect circuit with four routing wires. Each of the four routing wires may be configured to operate as a registered single data rate interconnection, a registered double data rate interconnection, or a combinational interconnection.

As shown, each routing wire of the pipelined interconnect circuit may include first stage multiplexer 430, second stage multiplexers 440, 442, and 450, configurable register 470, output multiplexer 460, driver 480, and control circuit 420. Control circuit 420 may load memory elements 410 with a desired pattern of bits to configure multiplexer 430, configurable register 470, and multiplexers 440, 442, 450, and 460.

Similar to multiplexer 302 of FIG. 3, each of the four first stage multiplexers 430 may select from multiple sources as directed by configuration memory elements 410. The multiple sources may include signals from outputs of functional blocks and other routing wires that travel in the same or in an orthogonal direction to the wire. The output of each of the four first stage multiplexers 430 may drive one of the intermediate wires 491, 492, 493, and 494 in bundle 490 that are shared between the four routing wires.

Second stage multiplexers 440 and 442 may select a signal from the four intermediate wires. As shown, each multiplexer 440 may select a signal from intermediate wires 493 and 494 and each multiplexer 442 may select a signal from the intermediate wires 491 and 492 as directed by configuration memory elements 410 in control circuit 420.

Third stage multiplexer 450 may select from the two second stage multiplexers 440 and 442 as directed by control circuit 420. Control circuit 420 may generate a control signal based on a periodic signal (e.g., clock signal CLK) and configuration memory elements 410.

For example, control circuit 420 may direct third stage multiplexer 450 to select a signal from second stage multiplexer 440, or control circuit 420 may direct third stage multiplexer 450 to select a signal from second stage multiplexer 442. Either signal may be a single data rate signal or a double data rate signal. If desired, control circuit 420 may direct third stage multiplexer 450 to select a signal from second stage multiplexer 440 during a first portion of a clock period and a signal from second stage multiplexer 442 during a second portion of that same clock period, thereby serializing the signals from second stage multiplexers 440 and 442 into a double data rate signal.

Configurable register 470 may store the signal selected by third stage multiplexer 450. Control circuit 420 may configure configurable register 470 to either operate in single data rate mode or in double data rate mode. In single data rate mode, configurable register 470 may store one signal during a clock period, whereas in double data rate mode, configurable register 470 may store a first signal during a first portion of the clock period and a second signal during a second portion of the clock period.

Control circuit 420 may configure configurable register 470 to operate in double data rate mode when third stage multiplexer 450 outputs a double data rate signal. For example, control circuit 420 may direct third stage multiplexer 450 to serialize the signals received from second stage multiplexers 440 and 442, thereby producing a double data rate signal. Alternatively, third stage multiplexer 450 may receive a double data rate signal (e.g., a signal that has been serialized in a prior pipelined interconnect circuit) from second stage multiplexer 440 or 442.

Control circuit 420 may configure configurable register 470 to operate in single data rate mode when third stage multiplexer 450 outputs a single data rate signal. For example, control circuit 420 may direct third stage multiplexer 450 to provide a single data rate signal received from either second stage multiplexer 440 or second stage multiplexer 442 to configurable register 470.

Figure 5A:
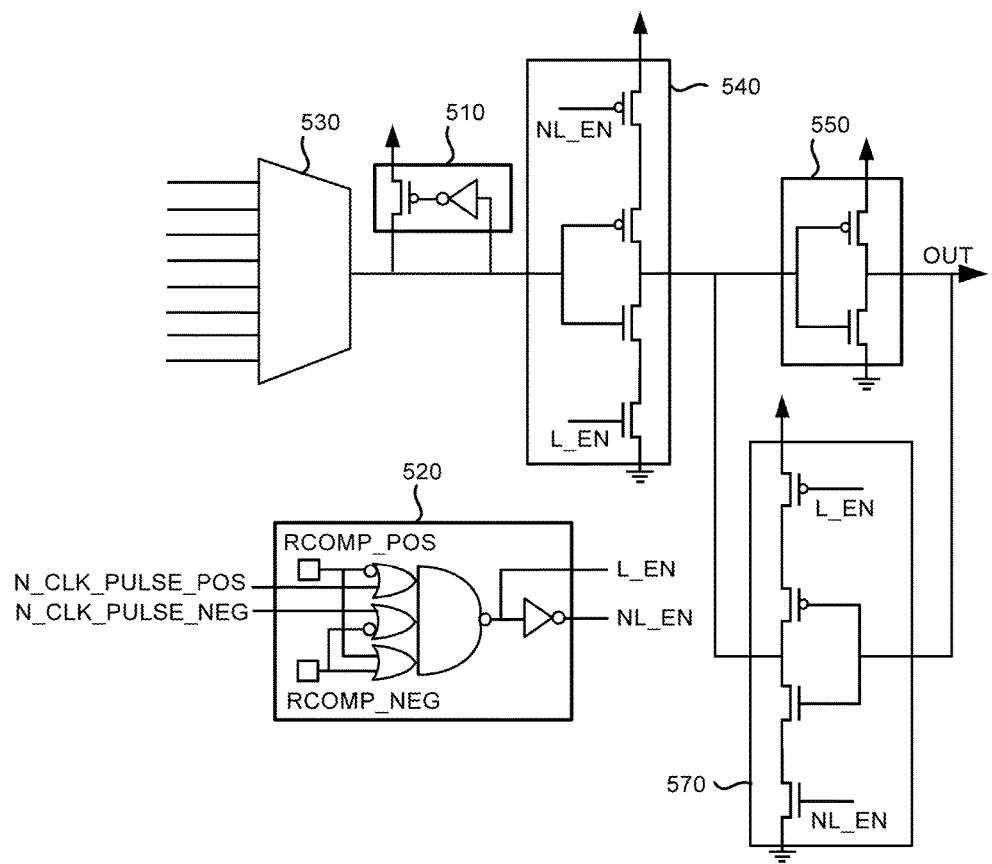
FIG. 5A is a diagram of an illustrative interconnect circuit with a configurable pulse latch and a control circuit in accordance with an embodiment.
Figure 5B:
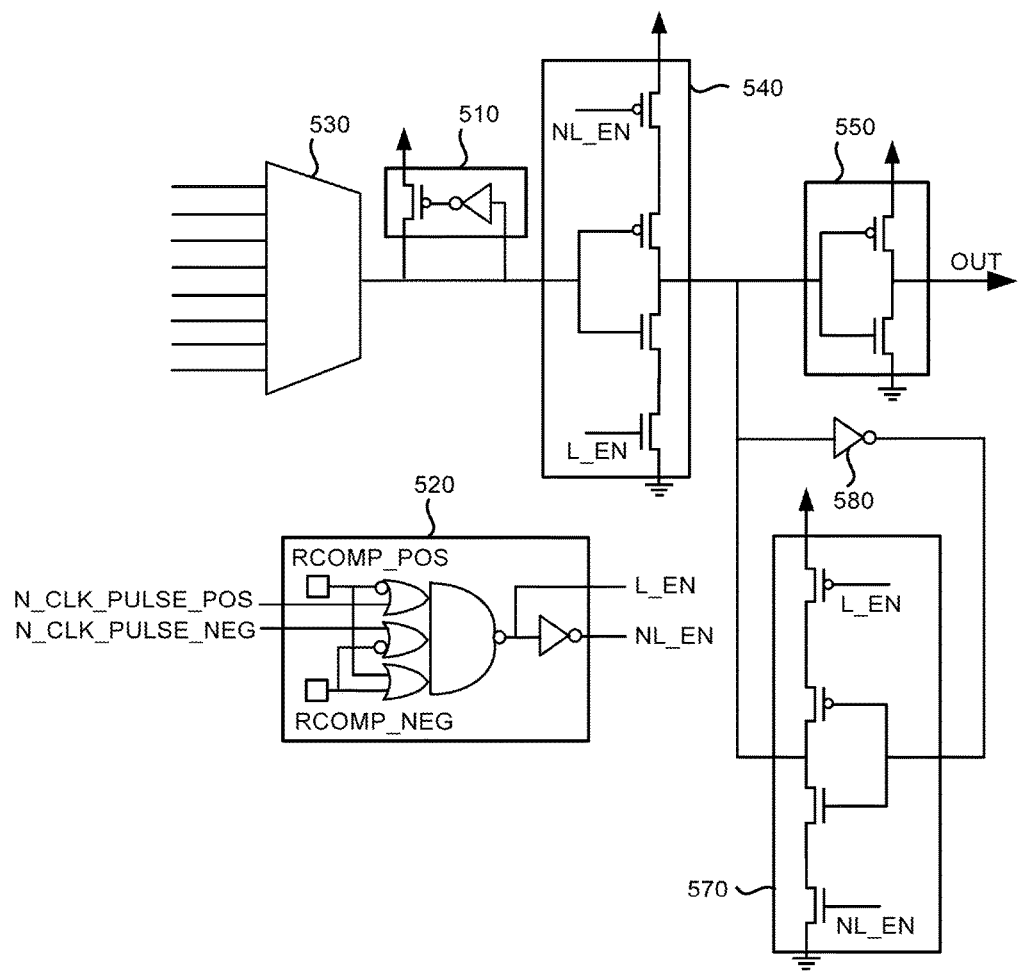
FIG. 5B is a diagram of another illustrative interconnect circuit with a configurable pulse latch and a control circuit in accordance with an embodiment.
Figure 6:
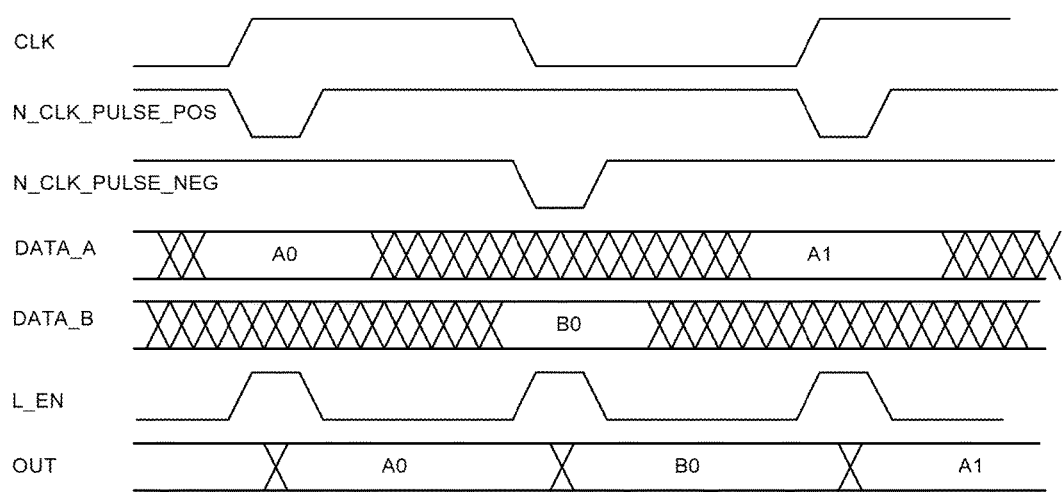
FIG. 6 is an illustrative waveform diagram that shows the behavior of the pulse latch of FIGS. 5A and 5B in accordance with an embodiment.

FIGS. 5A and 5B show diagrams of illustrative interconnect circuits with a configurable pulse latch and a control circuit. FIG. 6 shows an illustrative waveform diagram showing the behavior of the interconnect circuits of FIGS. 5A and 5B. As shown, the interconnect circuits may be configured to operate in single data rate mode, in double data rate mode, or in combinational mode.

As shown, the interconnect circuit of FIG. 5A may include multiplexer 530, pull-up circuit 510, tri-state buffers 540 and 570, inverter 550, and control circuit 520. Compared with FIG. 5A, the interconnect circuit of FIG. 5B may additionally include inverter 580. Tri-state buffer 570 and inverter 550 in FIG. 5A or tri-state buffer 570 and inverter 580 in FIG. 5B form a storage element, which is sometimes also referred to as a pipeline element or a memory element. The storage element is controlled by signals L_EN and NL_EN. The use of inverter 580 has the effect that the output of inverter 550 is decoupled from the input of tri-state buffer 570. Coupling inverter 580 between the output of tri-state buffer 540 and the input of tri-state buffer 570 may enable control circuit 520 to shorten the time during which signals L_EN and NL_EN are logic '1' and logic '0', respectively.

Similar to multiplexer 302 of FIG. 3, multiplexer 530 may be a driver input multiplexer (DIM) or a functional block input multiplexer (FBIM). A DIM drives a routing wire and may select from multiple sources that can drive the wire. The multiple sources may include signals from outputs of functional blocks and other routing wires that travel in the same or in an orthogonal direction to the wire. A FBIM outputs a signal to a functional block and may select the signal from multiple routing wires.

Multiplexer 530 is merely illustrative and not intended to limit the scope of the invention. If desired, multiplexer 530 may be implemented as a one-hot, fully decoded routing multiplexer with an arbitrary number of inputs and one output. Each of the inputs may be coupled to the output through a pass transistor, and the pass transistors may be controlled by configuration memory (not shown). The pass transistors may be arranged in several different ways. For example, all pass transistors may be arranged in parallel, or multiplexer 530 may include multiple multiplexing stages, each having several pass transistors arranged in parallel, and the multiple multiplexing stages may be cascaded, just to name a few alternatives for arranging the pass transistors in multiplexer 530.

If desired, a control circuit may direct multiplexer 530 to serialize two single data rate signals, similar to third stage multiplexer 450 of FIG. 4. Thus, multiplexer 530 may produce either a single data rate signal or a double data rate signal, which may be selected from one of the inputs or produced through serialization.

As shown, pull-up circuit 510 may include a PMOS pass transistors that is controlled by an inverter coupled between a supply voltage rail and the output of multiplexer 530. If desired, pull-up circuit 530 may have more than one PMOS pass transistors coupled in series. In the event that the output of multiplexer 530 is logic '1', pull-up circuit 510 conductively connects the voltage rail to the output of multiplexer 530, thereby restoring the voltage level of the signal that is logic '1' and may have dropped in voltage as a result of passing through the pass transistors of multiplexer 530.

Buffered tri-state 540 may be controlled by signals L_EN and NL_EN with NL_EN being the inversion of L_EN. For example, buffered tri-state 540 may behave as an inverter when signal L_EN is logic '1' and signal NL_EN is logic '0'. The output of buffered tri-state 540 may be in a high-impedance state when signal L_EN is logic '0' and signal NL_EN is logic '1'.

Buffered tri-state 570 may be controlled by signals L_EN and NL_EN with NL_EN being the inversion of L_EN. For example, buffered tri-state 570 may behave as an inverter when signal L_EN is logic '0' and signal NL_EN is logic '1'. The output of buffered tri-state 570 may be in a high-impedance state when signal L_EN is logic '1' and signal NL_EN is logic '0'.

Control circuit 520 may receive a negative pulse signal (N_CLK_PULSE_POS), which has a pulse from logic '1' to logic '0' and back to logic '1' whenever a clock signal (CLK) has a rising edge (see FIG. 6), a negative pulse signal (N_CLK_PULSE_NEG), which has a pulse from logic '1' to logic '0' and back to logic '1' whenever the clock signal (CLK) has a falling edge (see FIG. 6), an enable signal for the negative pulse at the rising edge (RCOMP_POS), which may be stored in a configuration memory element, and an enable signal for the negative pulse at the falling edge of the clock signal (RCOMP_NEG), which may be stored in a configuration memory element.

The enable signals RCOMP_POS and RCOMP_NEG may be used to enable or disable the use of the storage element formed by tri-state buffer 570 and inverter 550 in FIG. 7A and by tri-state buffer 570 and inverter 580 in FIG. 7B. In other words, control circuit 520 may configure the interconnect circuit to operate as a combinational interconnect circuit (i.e., as an interconnect circuit in which the output is only a function of the present input signals) or as a sequential interconnect circuit (i.e., as an interconnect circuit in which the output is a function of the present input signals and previously received input signals such as signals that are stored in the storage element). For example, when both enable signals RCOMP_POS and RCOMP_NEG are logic '0', signal L_EN may be set to logic '1' and signal NL_EN to logic '0' independent of the negative clock pulse signals N_CLK_PULSE_POS and N_CLK_PULSE_NEG. Thus, buffered tri-state 540 may behave as an inverter and buffered tri-state 570 may be in high-impedance state.

As an example, consider that the interconnect circuit operates as a combinational interconnect circuit (i.e., both RCOMP_POS and RCOMB_NEG are logic '0') and that a signal that is logic '0' is routed through multiplexer 530. This signal may cause pull-up circuit 510 to conductively disconnect the voltage rail from the input of tri-state buffer 540. Tri-state buffer 540 may invert the signal and produce a signal that is logic '1' at the input of inverter 550, and inverter 550 may produce a signal that is logic '0' at the output of the interconnect circuit (OUT).

As another example, consider that the interconnect circuit operates as a combinational interconnect circuit and that a signal that is logic ',1' is routed through multiplexer 530. This signal may cause pull-up circuit 510 to conductively connect the voltage rail to the input of tri-state buffer 540, thereby restoring the voltage level of the signal at the output of multiplexer 530. Tri-state buffer 540 may invert the signal and produce a signal that is logic '0' at the output of tri-state buffer 540. Inverter 550 may invert the signal at the output of tri-state buffer 540 and thereby produce a signal that is logic '1' at the output of the interconnect circuit (OUT).

Consider the scenario in which both enable signals RCOM_POS and RCOMP_NEG are set to logic '1' to configure the interconnect circuit to operate in double data rate mode. Consider further that multiplexer 530 serializes two single data rate signals DATA_A and DATA_B, similar to third stage multiplexer 450 of FIG. 4. Thus, multiplexer 530 may select single data rate signal DATA_A during a first portion of the clock period (e.g., during rising edges of signal CLK) and single data rate signal DATA_B during a second portion of the clock period (e.g., during falling edges of signal CLK). The waveform diagram for this scenario is shown in FIG. 6.

As shown in the waveform diagram, at every rising edge of signal CLK, signal N_CLK_PULSE_POS has a negative pulse, and at every falling edge of signal CLK, signal N_CLK_PULSE_NEG has a negative pulse. Since both enable signals are logic '1', control circuit 520 may generate signal L_EN as having a positive pulse at every clock edge and signal NL_EN as having a negative pulse at every clock edge.

As a result, during the positive pulse of signal L_EN and the negative pulse of signal NL_EN (i.e., at the first rising edge of clock signal CLK), buffered tri-state 540 may invert signal AO and inverter 550 may restore signal AO at the output OUT of the interconnect circuit. After the positive pulse of signal L_EN and the negative pulse of signal NL_EN, buffered tri-state 540 may transition into high-impedance state and buffered tri-state 570 may operate as an inverter, thereby forming a cross-coupled inverter pair with inverter 550 in FIG. 5A or with inverter 580 in FIG. 5B. The cross-coupled inverter pair may store signal AO at the output OUT.

During the next positive pulse of signal L_EN and the negative pulse of signal NL_EN (i.e., at the first falling edge of clock signal CLK), buffered tri-state 570 may transition into a high impedance state, buffered tri-state 540 may invert signal BO and inverter 550 may restore signal BO at the output OUT of the interconnect circuit. After the positive pulse of signal L_EN and the negative pulse of signal NL_EN, buffered tri-state 540 may transition into high-impedance state and buffered tri-state 570 may operate as an inverter, thereby forming a cross-coupled inverter pair with inverter 550 in FIG. 5A or with inverter 580 in FIG. 5B. The cross-coupled inverter pair may store signal BO at the output OUT. Thus, the interconnect circuit operates as a registered double data rate interconnect circuit.

As another example, consider setting enable signal RCOMP_POS to logic '0', which may suppress the positive pulse of signal L_EN and the negative pulse of signal NL_EN at rising edges of clock signal CLK. In this example, the interconnect circuit may operate as a registered single data rate interconnect circuit that stores a data signal at every falling edge of clock signal CLK.

As another example, consider setting enable signal RCOMP_NEG to logic '0', which may suppress the positive pulse of signal L_EN and the negative pulse of signal NL_EN at falling edges of clock signal CLK. In this example, the interconnect circuit may operate as a registered single data rate interconnect circuit that stores a data signal at every rising edge of clock signal CLK.

In the example of the interconnect circuits shown in FIGS. 5A and 5B, the control circuit 520 may select between operating the interconnect circuit as a combinational interconnect circuit and as a registered interconnect circuit. In the embodiments shown in FIGS. 3 and 4., multiplexer 308 or output multiplexer 460 may enable each routing wire to be either used in a non-pipeline mode (e.g., as a combinational interconnect circuit) or in a pipeline register mode (e.g., as a pipelined single data rate interconnection circuit if configurable register 470 operates in single data rate mode or as a pipelined double data rate interconnection circuit if configurable register 470 operates in double data rate mode). In the non-pipeline mode, output multiplexer 460 may select the direct output of third stage multiplexer 450.

In pipeline mode, output multiplexer 460 may select the output of configurable register 470. Output multiplexer 460 may provide its output to driver circuit 480, and the output of driver circuit 480 may be used to drive a routing wire. The routing wire may span multiple functional blocks (e.g., for a pipelined routing resource with a DIM). Alternatively, the routing wire may be inside a functional block (e.g., for a pipelined routing resource with a FBIM).

Figure 7:
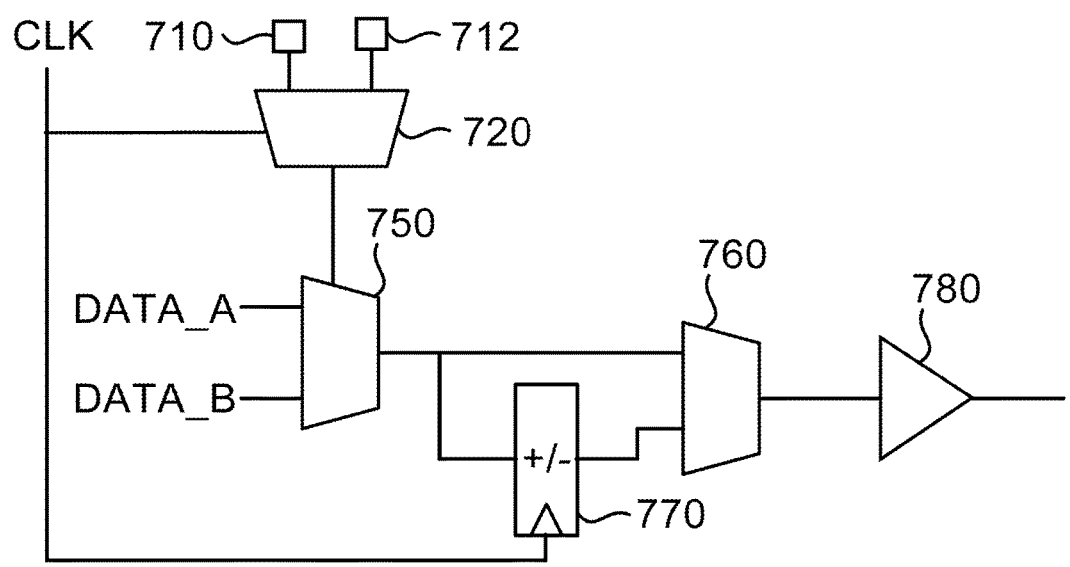
FIG. 7 is a diagram of an illustrative serialization circuit which uses a dual edge-triggered flip-flop in accordance with an embodiment.

FIG. 7 shows an embodiment of an interconnect circuit which is configurable to operate as a combinational interconnect circuit, a single data rate interconnect circuit, or a double data rate interconnect circuit. Similar to the interconnect circuit of FIG. 4, the interconnect circuit may include routing multiplexer 750, control multiplexer 720, configuration memory bits 710 and 712, configurable register 770, output multiplexer 760, and driver 780.

Control multiplexer 720 may generate a control signal based on a periodic signal (e.g., clock signal CLK) and configuration memory elements 710 and 712. Routing multiplexer 750 may select from signals DATA_A and DATA_B as directed by control multiplexer 720. Either signal (i.e., DATA_A and/or DATA_B) may be a single data rate signal or a double data rate signal. Consider for example that routing multiplexer 750 selects DATA_A when the control signal generated by control multiplexer 720 is logic '1' and that routing multiplexer 750 selects DATA_B when the control signal generated by control multiplexer 720 is logic '0'.

In this example, storing logic '1' in both configuration memory elements (i.e., in 710 and 712) may generate a control signal that is logic '1' independent of the periodic signal CLK, and routing multiplexer 750 may select signal DATA_A. Storing logic '0' in both configuration memory elements (i.e., in 710 and 712) may generate a control signal that is logic '0' independent of the periodic signal CLK, and routing multiplexer 750 may select signal DATA_B.

Storing logic '1' in configuration memory element 710 and logic '0' in configuration memory element 712 or storing logic '0' in configuration memory element 710 and logic '1' in configuration memory element 712 may result in a control signal that toggles between logic '0' and logic '1' based on the periodic signal CLK. In other words, the control signal may be logic '0' (or logic '1') during a first portion of a period of signal CLK and logic '1' (or logic '0') during a second portion of the same period of signal CLK. Thus, routing multiplexer 750 may select signal DATA_B (or DATA_A) during the first portion of the period of signal CLK and signal DATA_A (or DATA_B) during the second portion of the period of signal CLK, thereby serializing signal DATA_A and DATA_B into a double data rate signal.

Configurable register 770 may store the signal selected by routing multiplexer 750. Configurable register 770 may operate in single data rate mode (e.g., storing a new signal at each rising edge or at each falling edge of the periodic signal CLK) or in double data rate mode (e.g., storing a new signal at each rising and falling edge of the periodic signal CLK). In single data rate mode, configurable register 770 may store one signal during a clock period, whereas in double data rate mode, configurable register 770 may store a first signal during a first portion of the clock period and a second signal during a second portion of the clock period.

Output multiplexer 760 may enable the use of the interconnect circuit as a combinational interconnect circuit (e.g., by selecting the signal from routing multiplexer 750) or as a pipelined interconnection circuit (e.g., by selecting the signal from configurable register 770.

Output multiplexer 760 may provide its output to driver circuit 780, and the output of driver circuit 780 may be used to drive a routing wire. The routing wire may span multiple functional blocks (e.g., for a pipelined routing resource with a DIM). Alternatively, the routing wire may be inside a functional block (e.g., for a pipelined routing resource with a FBIM).

Figure 8:
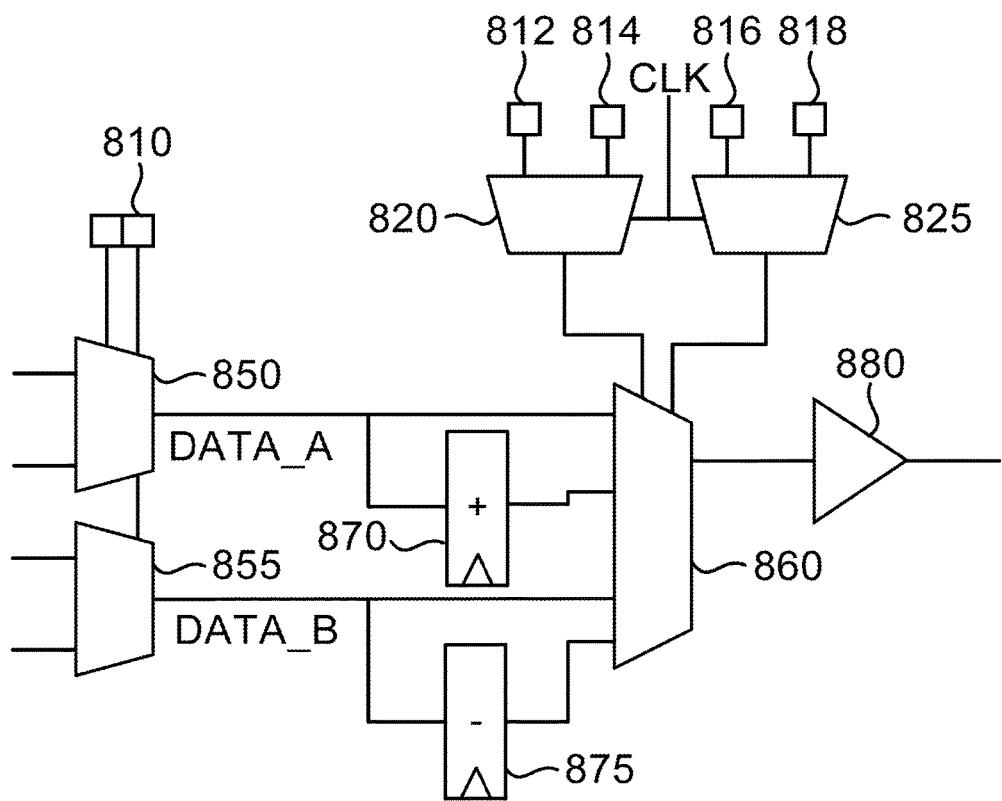
FIG. 8 is a diagram of an illustrative serialization circuit which uses two single edge-triggered flip-flops in accordance with an embodiment.

FIG. 8 shows another embodiment of an interconnect circuit which is configurable to operate as a combinational interconnect circuit, a single data rate interconnect circuit, or a double data rate interconnect circuit. As shown, the interconnect circuit may include routing multiplexers 850 and 855, control multiplexers 820 and 825, configuration memory bits 810, 812, 814, 816, and 718, rising edge triggered register 870, falling edge triggered register 875, output multiplexer 860, and driver 880.

As shown, routing multiplexers 850 and 855 may select from up to four different signals as directed by configuration memory bits 810. In the event that the interconnect circuit receives a double data rate signal, both routing multiplexers 850 and 855 may be required to select the same signal.

To facilitate access to the same signal, some or all of the inputs of routing multiplexers 850 and 855 may be coupled to the same routing resources and receive the same signals. Alternatively, routing multiplexers 850 and 855 may be coupled to different routing resources, similar to second stage multiplexers 440 and 442 in FIG. 4, and additional interconnect circuitry such as multiplexers 430 in FIG. 4 may ensure that both routing multiplexers 850 and 855 receive the same signal.

As an example, consider that routing multiplexers 850 and 855 have selected signals DATA_A and DATA_B, respectively and that both signals (i.e., DATA_A and DATA_B) are single data rate signals. Consider further that output multiplexer 860 selects the input from falling edge triggered register 875 when the control bits from control multiplexers 820 and 825 are logic '11', that output multiplexer 860 selects the input from rising edge triggered register 870 when the control bits from control multiplexers 820 and 825 are logic '01', that output multiplexer 860 selects the input from routing multiplexer 855 when the control bits from control multiplexers 820 and 825 are logic '10', and that output multiplexer 860 selects the input from routing multiplexer 850 when the control bits from control multiplexers 820 and 825 are logic '00'.

Control multiplexers 820 and 825 may each generate a control signal based on a periodic signal (e.g., clock signal CLK) and configuration memory elements 812, 814, 816, and 818. In this example, storing logic '0', '0', '0', '0' in configuration memory elements 812, 814, 816, and 818 or logic '1', '0', '1', '0' in configuration memory elements 812, 814, 816, and 818 may generate a control signal that is logic '00' or logic '10', respectively, independent of the periodic signal CLK. Thus, output multiplexer 860 may select signal DATA_A from routing multiplexer 850 or signal DATA_B from routing multiplexer 855, respectively, and the interconnect circuit may behave as a combinational interconnect circuit.

Storing logic '0', '1', '0', and '1' in configuration memory elements 812, 814, 816, and 818, respectively, may generate a control signal that is logic '01' independent of the periodic signal CLK, and output multiplexer 860 may select the signal stored in rising edge triggered register 870. Storing logic '1', '1', '1', and '1' in configuration memory elements 812, 814, 816, and 818, respectively, may generate a control signal that is logic '11' independent of the periodic signal CLK, and output multiplexer 860 may select the signal stored in falling edge triggered register 870. In these cases, the interconnect circuit may behave as a registered single data rate interconnect circuit.

Storing logic '0', '1', '1', and '1' in configuration memory elements 812, 814, 816, and 818, respectively, may generate a control signal that toggles between logic '01' and logic '11' based on the periodic signal CLK. In other words, the control signal may be logic '01' (or logic '11') during a first portion of a period of signal CLK and logic '11' (or logic '01') during a second portion of the same period of signal CLK. Thus, output multiplexer 860 may select the signal stored in the rising edge triggered register (or the signal stored in the falling edge triggered register) during the first portion of the period of signal CLK and the signal stored in the falling edge triggered register (or the signal stored in the rising edge triggered register) during the second portion of the period of signal CLK, thereby serializing stored signals into a registered double data rate signal.

Output multiplexer 860 may provide its output to driver circuit 880, and the output of driver circuit 880 may be used to drive a routing wire. The routing wire may span multiple functional blocks (e.g., for a pipelined routing resource with a DIM). Alternatively, the routing wire may be inside a functional block (e.g., for a pipelined routing resource with a FBIM).

Figure 9:
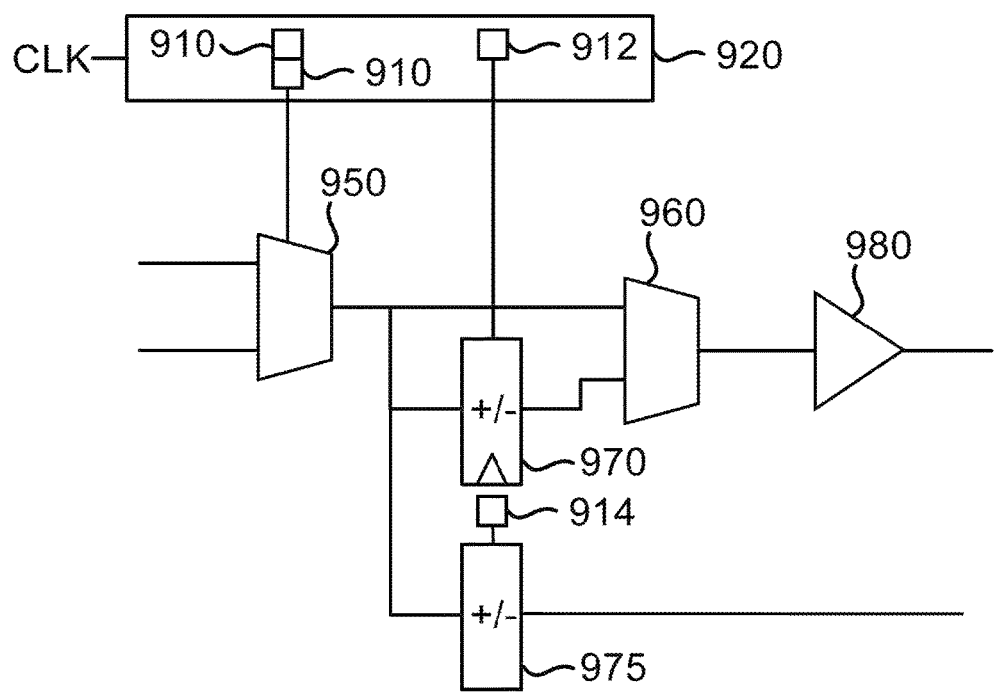
FIG. 9 is a diagram of an illustrative de-serialization circuit which uses a single routing multiplexer in accordance with an embodiment.

Further processing of double data rate signals may require de-serialization into single data rate signals. As an example, this may be accomplished using two instances of the circuit of FIG. 8 configured to register the input in positive and negative edge modes respectively. Alternatively, FIG. 9 shows an embodiment of an interconnect circuit that may be configured to operate in combinational mode, single data rate mode, double data rate mode, and to de-serialize a double data rate signal.

As shown, the interconnect circuit may include routing multiplexer 950, configurable double edge triggered registers 970 and 975, output multiplexer 960, driver 980, control circuit 920, and configuration memory bits 910, 912, and 914. The interconnect circuit may be configured to operate in combination mode, single data rate mode, and double data rate mode similar to the interconnect circuit of FIG. 7.

Consider the example in which routing multiplexer 950 receives a double data rate signal on an input and that control circuit 920 selects the double data rate signal for de-serialization. In this example, configuration bit 912 may configure configurable double edge triggered register 970 as a rising edge triggered register, and configuration bit 914 may configure double edge triggered register 975 as a falling edge triggered register. Alternatively, configuration bit 912 may configure configurable double edge triggered register 970 as a falling edge triggered register, and configuration bit 914 may configure double edge triggered register 975 as a rising edge triggered register.

In this configuration, register 970 may store a first portion of the double data rate signal, and register 975 may store a second portion of the double data rate signal, thereby reproducing a first single data rate signal in register 970 and a second single data rate signal in register 975.

Output multiplexer 960 may select the single data rate signal from register 970 and provide its output to driver circuit 980, and the output of driver circuit 980 may drive the first single data rate signal onto a routing wire. Register 975 may provide the second single data rate signal onto another routing wire either directly or indirectly through additional circuitry (not shown).

Figure 10:
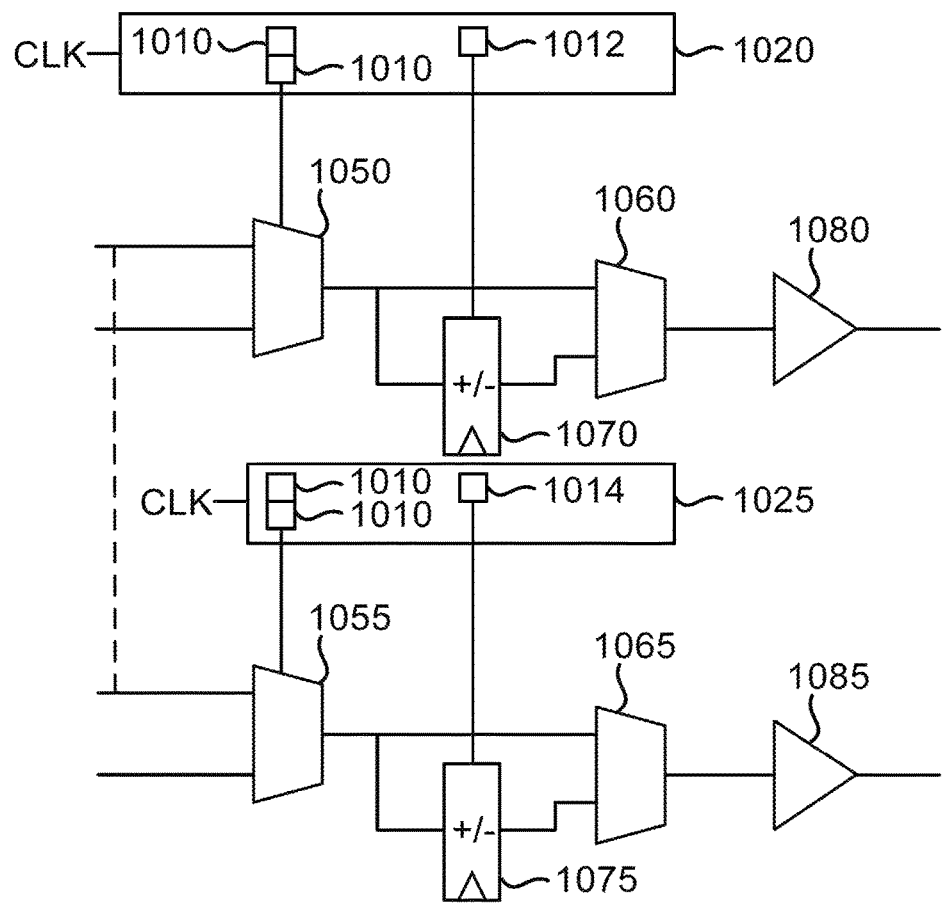
FIG. 10 is a diagram of an illustrative de-serialization circuit which uses two routing multiplexers in accordance with an embodiment.

De-serialization as shown in FIG. 9 may require an additional double edge triggered register (e.g., register 975). FIG. 10 shows another embodiment of an interconnect circuit that may be configured to operate in combinational mode, single data rate mode, double data rate mode, and to de-serialize a double data rate signal.

As shown, the interconnect circuit may have two routing wires. Each of the routing wires may include a routing multiplexer (e.g., routing multiplexers 1050 and 1055), a configurable double edge triggered register (e.g., registers 1070 and 1075), an output multiplexer (e.g., output multiplexers 1060 and 1065), a driver (e.g., drivers 1080 and 1085), a control circuit (e.g., control circuits 1020 and 1025), and configuration memory bits 1010, 1012, and 1014. The interconnect circuit may be configured to operate in combinational mode, single data rate mode, and double data rate mode similar to the interconnect circuit of FIG. 7 or the interconnect circuit in FIG. 4.

The interconnect circuit of FIG. 10 may de-serialize a double data rate signal by routing the same signal to both routing wires. For example, one of the inputs of routing multiplexers 1050 and 1055 may be coupled together and the double data rate signal may be routed to these inputs. Alternatively, additional routing circuitry may route the same double data rate signal to routing multiplexers 1050 and 1055.

Control circuits 1020 and 1025 may configure routing multiplexers 1050 and 1055, respectively, to choose the double data rate signal. Control circuit 1020 and 1025 may further configure registers 1070 and 1075 as a rising (falling) and a falling (rising) edge triggered register, respectively. Thus, register 1070 may store a first portion of the double data rate signal, and register 1075 may store a second portion of the double data rate signal, thereby reproducing a first single data rate signal in register 1070 and a second single data rate signal in register 1075.

Output multiplexers 1060 and 1065 may select the first and second single data rate signals from registers 1070 and 1075 and provide the first and second single data rate signals to driver circuits 1080 and 1085, which may drive the first and second single data rate signals onto first and second routing wires.

Figure 11:
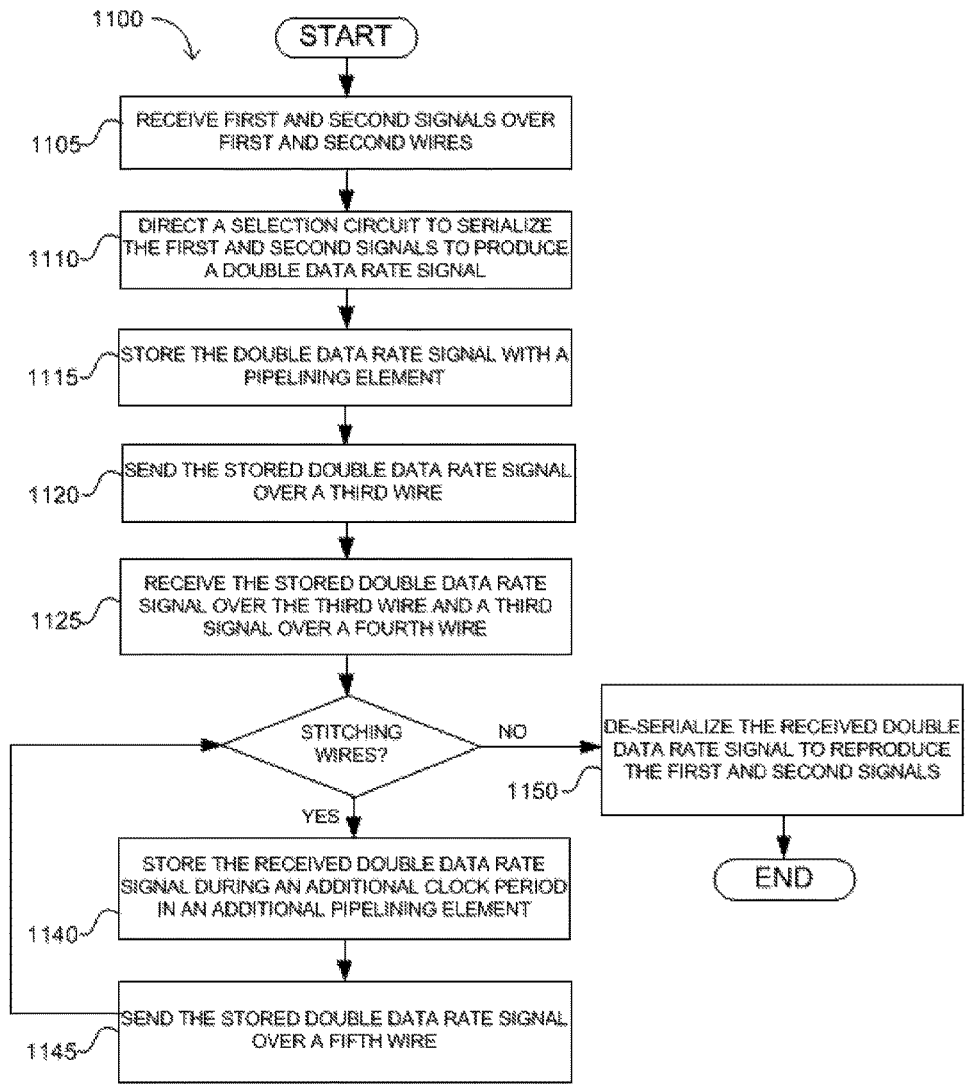
FIG. 11 is a flow chart showing illustrative steps for operating interconnect circuitry in double data rate mode in accordance with an embodiment.

FIG. 11 is a flow chart showing illustrative steps for operating interconnect circuitry (e.g., connected instances of the interconnect circuit of FIG. 10) in double data rate mode including serialization of single data rate signals, transmission of the signals through pipelined interconnect circuitry, an de-serialization of the double data rate signal to restore the initial single data rate signals.

During step 1105, a first interconnect circuit of the interconnect circuitry may receive first and second signals over first and second wires. During step 1110, the interconnect circuitry (e.g., control circuit 1020 of FIG. 10) may direct a selection circuit (e.g., routing multiplexer 1050 of FIG. 10) to serialize the first and second signals to produce a double data rate signal.

During step 1115, the interconnect circuit may store the double data rate signal with a pipelining element (e.g., register 1070 of FIG. 10). During step 1020, the first interconnect circuit may send the stored double data rate signal over a third wire, and a second interconnect circuit of the interconnect circuitry may receive the double data rate signal over the third wire and a fourth signal over a fourth wire during step 1125.

In the event that the double data rate signal is required to be sent over another segment to a third interconnect circuit, wires may need to be stitched. If wire stitching is required, the second interconnect circuit may store the received double data rate signal during an additional clock period in an additional pipelining element (e.g., register 1070 of the second interconnect circuit) during step 1140. During step 1145, the second interconnect circuit may send the stored double data rate signal over a fifth wire.

In the event that further wire stitching is required, steps 1140 and 1145 may be repeated iteratively. In the event that no further wire stitching is required, another interconnect circuit of the interconnect circuitry may de-serialize the received double data rate signal to reproduce the first and second signals during step 1150.

Computer-aided design (CAD) tools, some or all of which are sometimes referred to collectively as a CAD tool or an electronic design automation (EDA) tool, may configure interconnect circuits such as interconnect circuits of FIGS. 4, 5A, 5B, 7, 8, 9, and 10, when implementing a circuit design on an integrated circuit.

For example, the CAD tools may include a design and constraint entry tool that may allow a circuit designer to provide a circuit design description (e.g., using a hardware description language such as Verilog hardware description language (Verilog HDL), Very High Speed Integrated Circuit Hardware Description Language (VHDL), SystemVerilog, or a higher-level circuit description language such as OpenCL or SystemC, just to name a few) and related constraint data (e.g., timing requirements such as maximum interconnect delays, false paths, multi-cycle paths, just to name a few).

If desired, the CAD tools may include logic synthesis and optimization tools and placement and routing tools. Logic synthesis and optimization tools may optimize the design by making appropriate selections of hardware to implement different logic functions in the circuit design based on the circuit design description and constraint data, thereby creating a gate-level netlist.

After logic synthesis and optimization using logic synthesis and optimization tools, the placement and routing tools may perform physical design steps (layout synthesis operations). Placement and routing tools may determine where to place each gate of the gate-level netlist produced by logic synthesis and optimization tools. For example, if two counters interact with each other, the placement and routing tools may locate these counters in adjacent regions to reduce interconnect delays or to satisfy timing requirements specifying the maximum permitted interconnect delay. The placement and routing tools may create orderly and efficient implementations of circuit designs for any targeted integrated circuit (e.g., for a given programmable integrated circuit such as a field-programmable gate array (FPGA).)

As an example, consider the scenario in which the placement and routing tools determines that a given path between a first placed gate and a second placed gate cannot be routed due to routing congestion in an interconnect circuit between the first and second placed gate. In response to determining that the given path between the first and second placed gate cannot be routed due to routing congestion, the placement and routing tools may attempt to use at least one of the interconnect circuits between the first and second placed gates in double-data rate mode.

If desired, the placement and routing tools may iteratively perform the steps of routing a connection using an interconnect circuit, determining routing congestion in the interconnect circuit, re-routing the connection using the interconnect circuit in double-data rate mode for all connections for which initial routing using interconnect circuits in single-data rate mode has failed. Alternatively the user may designate certain connections as being at a double data rate, and the CAD tool may place and route them, configuring the multiplexers in an appropriate manner.

CAD tools such as logic synthesis and optimization tools and placement and routing tools may be part of a compiler suite (e.g., part of a suite of compiler tools provided by a programmable logic device vendor). In accordance with the present invention, the CAD tools may also include timing analysis tools such as timing estimators. This allows logic synthesis and optimization tools and placement and routing tools to satisfy performance requirements (e.g., timing requirements) before actually producing the integrated circuit.

As an example, the timing analysis tools may determine that a given interconnect path may not meet the maximum interconnect delay specified in the constraint data. In response to receiving the information that the given interconnect path may not meet the maximum interconnect delay, the logic synthesis and optimization tools or the placement and routing tools may perform register pipelining of the given paths in order to provide for shorter delays that meet the maximum interconnect delay in exchange for increased latency.

The method and apparatus described herein may be incorporated into any suitable electronic device or system of electronic devices. For example, the method and apparatus may be incorporated into numerous types of devices such as microprocessors or other ICs. Exemplary ICs include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), digital signal processors (DSPs), graphics processing units (GPUs) just to name a few.

The integrated circuit described herein may be part of a data processing system that includes one or more of the following components; a processor; memory; I/O circuitry; and peripheral devices. The integrated circuit can be used in a wide variety of applications, such as computer networking, data networking, instrumentation, video processing, digital signal processing, or any suitable other application where the advantage of using interconnection circuits that may be configured to operate in combinational mode, single data rate mode, or double data rate mode is desirable.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention.

What is claimed is:

1. An integrated circuit, comprising:
 a selection circuit configured to receive first and second signals;
 control circuitry coupled to the selection circuit and configured to receive a clock signal and to control the selection circuit to generate a double data rate signal based on the clock signal by serializing the first and second signals, wherein the selection circuit is configured to generate the double data rate signal in a first mode of operation and to generate a single data rate signal in a second mode of operation; and
a storage element coupled to the selection circuit and configured to store the double data rate signal.

2. The integrated circuit defined in claim 1, further comprising:
a driver circuit having an input and an output; and
an additional selection circuit interposed between the input of the driver circuit and the storage element and configured to selectively provide the stored double data rate signal to the driver circuit.

3. The integrated circuit defined in claim 2, wherein the additional selection circuit includes an input terminal that is directly connected to the selection circuit.

4. The integrated circuit defined in claim 3, wherein the control circuitry is configured to control the additional selection circuit to bypass the storage element and provide data signals received at the input terminal of the additional selection circuit to the input of the driver circuit.

5. The integrated circuit defined in claim 1, further comprising:
an additional storage element coupled to the selection circuit, wherein the storage element and the additional storage element are configured to de-serialize an output signal of the selection circuit.

6. The integrated circuit defined in claim 5, wherein the additional storage element is configured to store only a portion of the output signal during a clock period of the clock signal.

7. The integrated circuit defined in claim 1, wherein the storage element is configured to store a first portion of the double data rate signal that includes the first signal during a first portion of a clock period of the clock signal and the storage element is configured to store a second portion of the double data rate signal that includes the second signal during a second portion of the clock period of the clock signal.

8. The integrated circuit defined in claim 1, wherein the control circuitry is configured to control the selection circuit to select the first signal during a first portion of a clock period of the clock signal and to select the second signal during a second portion of the clock period of the clock signal.

9. The integrated circuit defined in claim 1, wherein the control circuitry is coupled to the storage element, wherein, in the first mode of operation, the control circuitry configures the storage element to store the first and second signals during respective portions of a given clock period in the clock signal, and wherein, in the second mode of operation, the control circuitry configures the storage element to store a signal selected from one of the first and second signals during an additional clock period in the clock signal.

10. Interconnect circuitry, comprising:
a multiplexer that receives a plurality of routing signals and selects a routing signal from the plurality of routing signals;
a mode selection circuit that receives a clock signal and that produces a mode selection signal based on the clock signal; and
a pipeline circuit that receives the mode selection signal from the mode selection circuit and that receives the selected routing signal from the multiplexer, wherein the pipeline circuit operates in a selected one of a double data rate mode and a storage bypass mode based on the mode selection signal.

11. The interconnect circuitry defined in claim 10, wherein the pipeline circuit further comprises:
a memory element that operates in double data rate mode, wherein the memory element stores a first portion of the selected routing signal during a first portion of a period of the clock signal and a second portion of the selected routing signal during a second portion of the period of the clock signal.

12. The interconnect circuitry defined in claim 10, wherein the pipeline circuit further comprises:
a deserialization circuit that receives the selected routing signal and produces first and second portions of the selected routing signal on first and second outputs.

13. The interconnect circuitry defined in claim 12, wherein the deserialization circuit further comprises:
a first memory element that stores the first portion of the selected routing signal during a first portion of a period of the clock signal; and
a second memory element that stores the second portion of the selected routing signal during a second portion of the period of the clock signal.

14. The interconnect circuitry defined in claim 10, further comprising:
an additional multiplexer that receives an additional plurality of routing signals and selects an additional routing signal among the additional plurality of routing signals; and
a serialization circuit that is coupled to the pipeline circuit and that receives the selected routing signal from the multiplexer and the selected additional routing signal from the additional multiplexer, wherein the serialization circuit sends a serialized routing signal to the pipeline circuit by sending the selected routing signal during a first portion of a period of the clock signal and the selected additional routing signal during a second portion of a period of the clock signal.

15. The interconnect circuitry defined in claim 10, wherein the pipeline circuit additionally operates in single data rate mode based on the mode selection signal.

16. An integrated circuit, comprising:
interconnect circuitry configured to receive first and second signals and to generate a third signal based on the first and second signals; and
control circuitry coupled to the interconnect circuitry and configured to provide control signals that operate the interconnect circuitry as a double data rate interconnect circuit in a first mode, a single data rate interconnect circuit in a second mode, and a storage bypass interconnect circuit in a third mode.

17. The integrated circuit defined in claim 16, wherein the interconnect circuitry includes a multiplexer configured to receive the first signal and the second signal and to generate an output signal based on the first and second signal.

18. The integrated circuit defined in claim 17, wherein the interconnect circuitry includes an additional multiplexer directly coupled to the multiplexer via a wired path and coupled to the multiplexer through a pipeline element.

19. The integrated circuit defined in claim 18, wherein the storage bypass interconnect circuit in the third mode generates the third signal by bypassing the pipeline element.

* * * * *